(12) United States Patent
Mitard et al.

(10) Patent No.: US 9,123,566 B2
(45) Date of Patent: Sep. 1, 2015

(54) COMPLEMENTARY METAL-OXIDE-SEMICONDUCTOR DEVICE COMPRISING SILICON AND GERMANIUM AND METHOD FOR MANUFACTURING THEREOF

(71) Applicant: IMEC, Leuven (BE)

(72) Inventors: Jerome Mitard, Tourinnes-la-Grosse (BE); Liesbeth Witters, Everberg (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/935,324

(22) Filed: Jul. 3, 2013

(65) Prior Publication Data

US 2014/0008730 A1  Jan. 9, 2014

(30) Foreign Application Priority Data

Jul. 3, 2012  (EP) .................................. 12174733

(51) Int. Cl.
| | |
|---|---|
| H01L 21/70 | (2006.01) |
| H01L 27/092 | (2006.01) |
| H01L 21/8238 | (2006.01) |
| H01L 21/84 | (2006.01) |
| H01L 27/12 | (2006.01) |

(52) U.S. Cl.
CPC ...... *H01L 27/092* (2013.01); *H01L 21/823807* (2013.01); *H01L 21/823821* (2013.01); *H01L 21/845* (2013.01); *H01L 27/0924* (2013.01); *H01L 27/1211* (2013.01)

(58) Field of Classification Search
CPC .............. H01L 27/092; H01L 27/1211; H01L 27/0924; H01L 21/823807
USPC .......................................... 257/369; 438/199
See application file for complete search history.

(56) References Cited

U.S. PATENT DOCUMENTS

| | | | |
|---|---|---|---|
| 2004/0178406 A1 | 9/2004 | Chu | |
| 2010/0044754 A1* | 2/2010 | Boyanov et al. | 257/192 |
| 2010/0133617 A1* | 6/2010 | Hanafi | 257/348 |
| 2011/0227170 A1* | 9/2011 | Zhu et al. | 257/410 |
| 2012/0319211 A1* | 12/2012 | van Dal et al. | 257/401 |
| 2013/0087833 A1* | 4/2013 | Wang | 257/192 |
| 2013/0292767 A1* | 11/2013 | Yang et al. | 257/347 |
| 2014/0008700 A1* | 1/2014 | Rachmady et al. | 257/192 |

* cited by examiner

*Primary Examiner* — Christine Enad
(74) *Attorney, Agent, or Firm* — McDonnell Boehnen Hulbert & Berghoff LLP

(57) ABSTRACT

Disclosed are complementary metal-oxide-semiconductor (CMOS) devices and methods of manufacturing such CMOS devices. In some embodiments, an example CMOS device may include a substrate, and a buffer layer formed on the substrate, where the buffer layer comprises $Si_{1-x}Ge_x$, where x is less than 0.5. The example CMOS device may further include one or more pMOS channel layer elements, where each pMOS channel layer element comprises $Si_{1-y}Ge_y$, and where y is greater than x. The example CMOS device may still further include one or more nMOS channel layer elements, where each nMOS channel layer element comprises $Si_{1-z}Ge_z$, and where z is less than x. In some embodiments, the example CMOS device may be a fin field-effect transistor (FinFET) CMOS device and may further include a first fin structure including the pMOS channel layer element(s) and a second fin structure including the nMOS channel layer element(s).

5 Claims, 19 Drawing Sheets

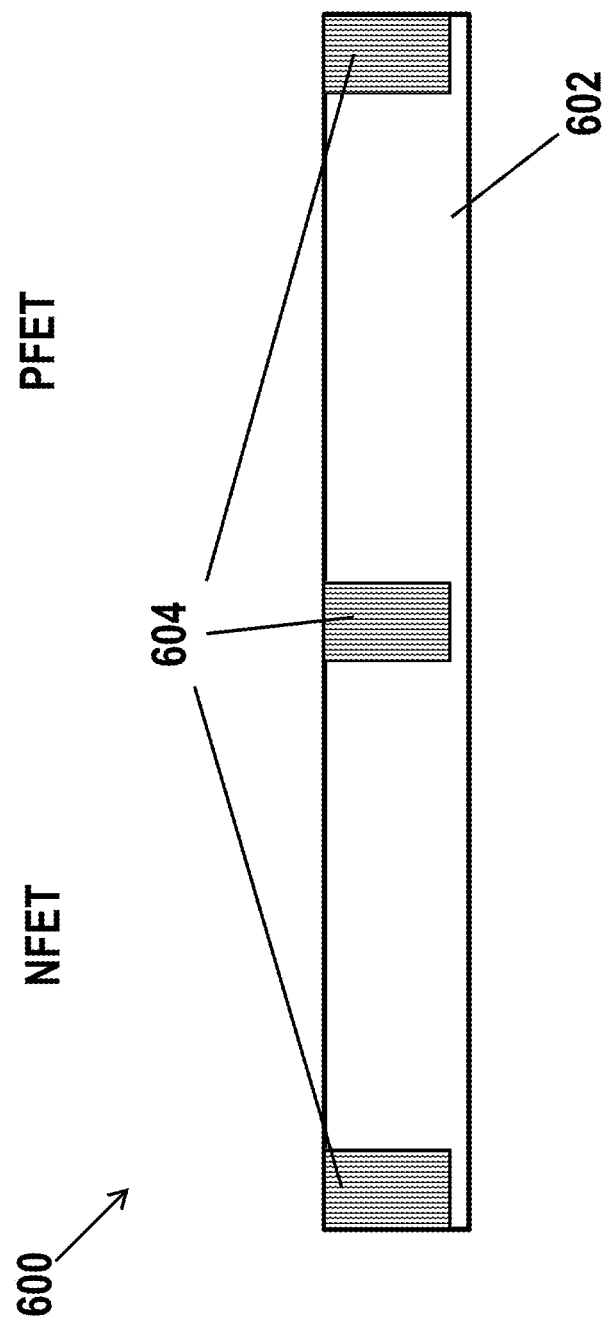

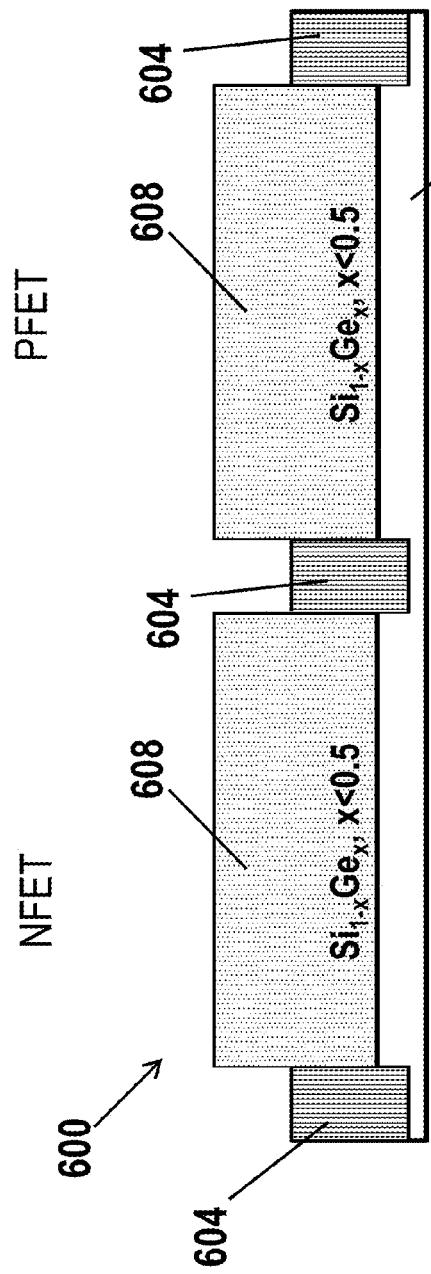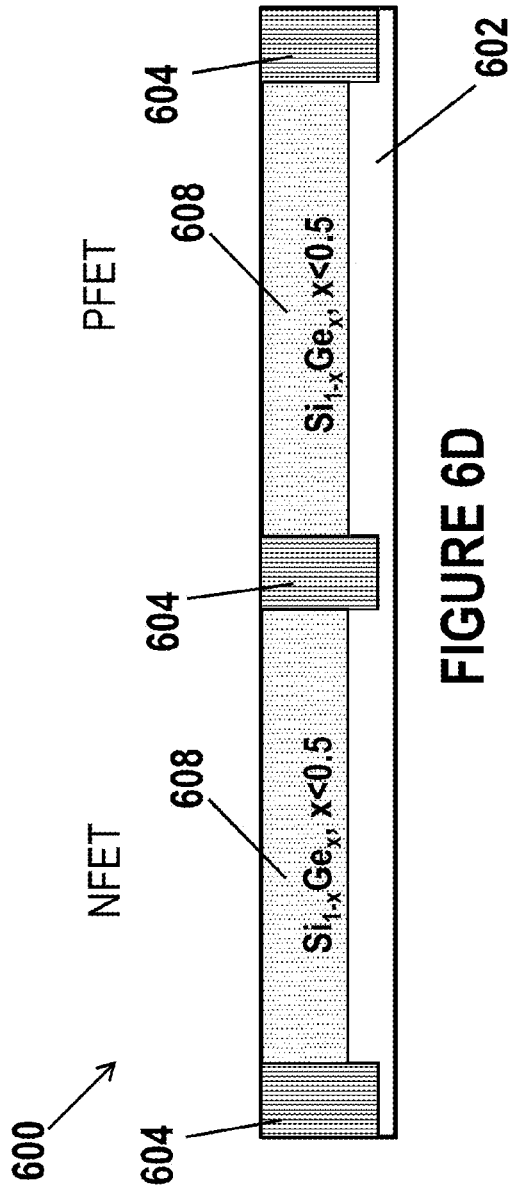

COMPLEMENTARY METAL-OXIDE-SEMICONDUCTOR DEVICE COMPRISING SILICON AND GERMANIUM AND METHOD FOR MANUFACTURING THEREOF

CROSS-REFERENCE TO RELATED APPLICATIONS

This application claims priority to European Patent Application Serial No. EP 12174733.1 filed on Jul. 3, 2012, the contents of which are hereby incorporated by reference.

BACKGROUND

Strained crystalline layers may be used in complementary metal-oxide-semiconductor (CMOS) devices. For example, in U.S. Patent Application Pub. No. 2004/178406A1, Chu discloses a strained crystalline layer having a tensile-strained silicon germanium (SiGe) portion and a compressive-strained SiGe portion. Alternatively, in some embodiments disclosed by Chu, the tensile-strained SiGe may instead be a tensile-strained silicon (Si) layer and the compressive-strained SiGe layer may instead be a compressive-strained germanium (Ge) layer.

According to Chu, the strained crystalline layer may be epitaxially bonded, or grown, on top of a SiGe relaxed buffer layer, such that the tensile-strained layer has a Ge concentration below that of the SiGe relaxed buffer, and the compressive-strained layer has a Ge concentration above that of the SiGe relaxed buffer. Chu explains that such a strained crystalline layer and relaxed buffer may be formed on top a semi-insulator substrate or on top of an insulating divider layer.

As disclosed by Chu, the tensile-strained layer may be suitable for hosting electron-conduction type devices, and the compressive-strained layer may be suited for hosting hole-conduction type devices. Implanted source and/or drain structures are further disclosed.

SUMMARY

Implanted source and/or drain structures, such as those disclosed by Chu, are not expected to work at the advanced node scale (that is, gate lengths below 30 nm), because for such reduced gate lengths, dopants are needed to counteract short channel effects, which results in stress relaxation and performance loss, including a reduced drive current and instability of electrical parameters (e.g., variability effect).

Disclosed are complementary metal-oxide-semiconductor (CMOS) devices that may be effectively manufactured and used in applications required at the advanced node scale. Also disclosed are methods of manufacturing the disclosed CMOS devices. In some embodiments, the disclosed CMOS devices may take the form of Fin Field-Effect Transistor (FinFET) devices. Alternatively or additionally, in some embodiments the disclosed CMOS devices may be non-planar devices (e.g., non-planar FinFET devices and/or non-planar three-dimensional (3D) gate type devices). Other CMOS devices are possible as well.

The disclosed CMOS devices may provide the advantage of good channel passivation and reduced junction leakage. The latter is especially the case when a low Germanium (Ge) concentration is used for a buffer layer of the CMOS device, such as a Ge concentration below about 0.35, below about 0.25, below about 0.15, or even below about 0.05.

For the disclosed pMOS FinFETs, little or no "exotic" channel passivation is needed, as a result of a low Ge content in the pMOS channel layer elements. Similarly, for the disclose nMOS FinFETS, little or no channel passivation is needed, as compared to devices including III-V or Si nMOS channel layer elements.

By using a low concentration of Ge in the buffer layer, a junction leakage of the disclosed CMOS devices may be minimized for low-power applications.

For the purpose of the present disclosure, whenever ranges are defined, it is intended to disclose these ranges in their closed, open, and two half open forms. All these options are meant to be disclosed even if the term "between" is used in the context of defining such ranges.

BRIEF DESCRIPTION OF THE DRAWINGS

The disclosure will be further elucidated by means of the following description and the appended figures.

DETAILED DESCRIPTION

Figure 1:
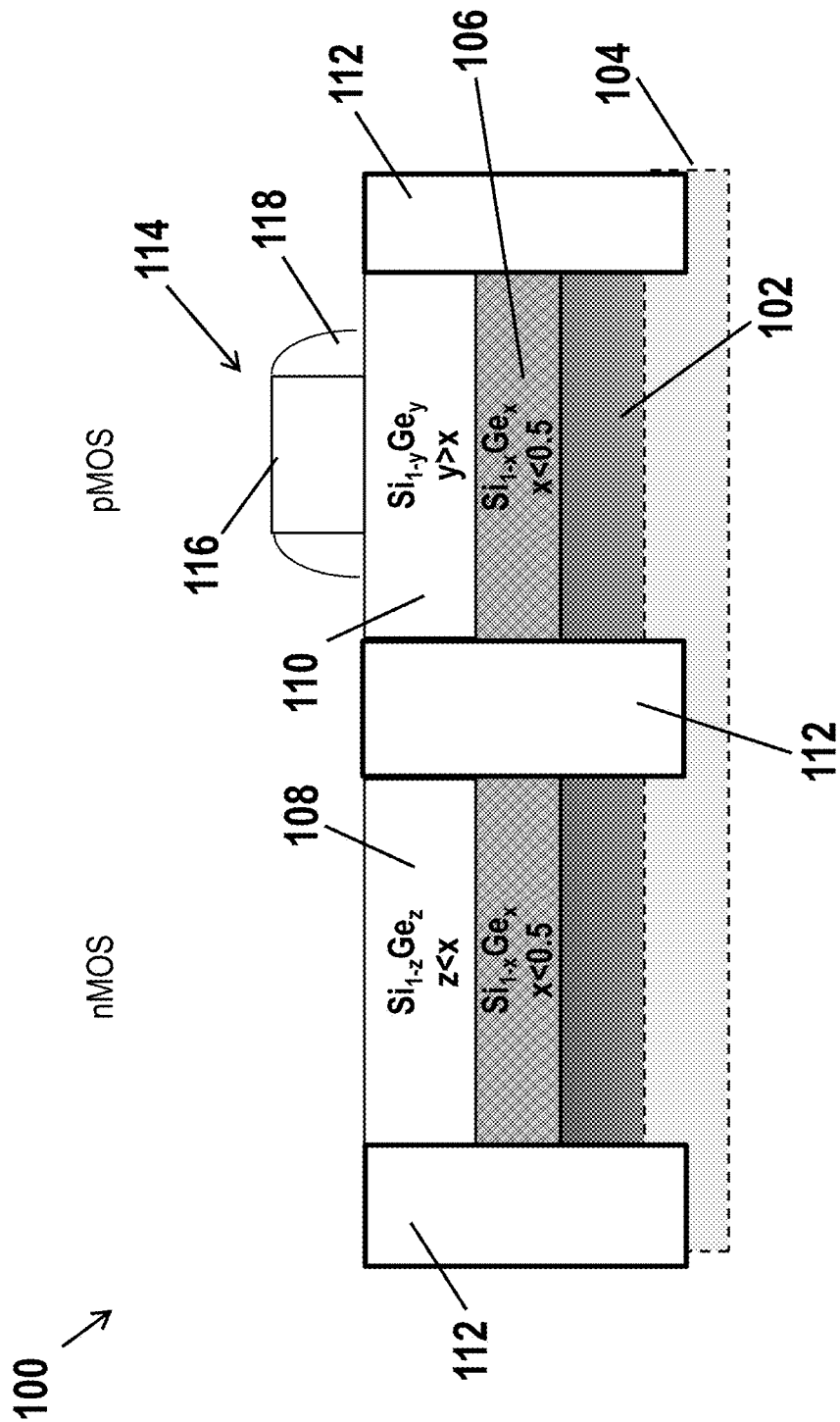
FIG. 1 illustrates an example complementary metal-oxide-semiconductor (CMOS) device, in accordance with some embodiments.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as example manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIG. 1 illustrates an example complementary metal-oxide-semiconductor (CMOS) device 100, in accordance with some embodiments. As shown, the CMOS device 100 includes a substrate 102. The substrate 102 may be formed of, for example, Si. As another example, the substrate 102 may take the form of a Si-on-insulator (SOI) substrate or a strained SOI (sSOI) substrate. In these embodiments, the substrate 102 may be formed on an oxide layer 104, as shown. In other embodiments, no oxide layer 104 may be present. In still other embodiments, the substrate may take the form of a fully-relaxed SiGe bulk substrate or a III-V-based substrate. Other substrates are possible as well.

As shown, the CMOS device 100 further includes a buffer layer 106. The buffer layer 106 may be formed of $Si_{1-x}Ge_x$, where x is smaller than 0.5. In some embodiments, x may be between about 0.15 and about 0.45, or between about 0.15 and about 0.35, or about 0.25.

In embodiments where the CMOS device 100 is to include one or more nMOS devices, the CMOS device 100 may further include one or more nMOS channel layer elements 108. Similarly, in embodiments where the CMOS device 100 is to include one or more pMOS devices, the CMOS device 100 may further include one or more pMOS channel layer elements 110. While the CMOS device 100 is shown to include both nMOS channel layer elements 108 and pMOS channel layer elements 110, in some embodiments the CMOS device 100 may include only one or the other of the nMOS channel layer elements 108 and pMOS channel layer elements 110.

Each of the nMOS and pMOS channel layer elements 108, 110 may be formed of a portion of a channel layer. The nMOS and pMOS channel layer elements 108, 110 may be provided on the buffer layer 106 in any number of manners and may be arranged in any number of manners. The nMOS and pMOS channel layer elements 108, 110 may, for instance, be rectangular, rectangular with rounded corners, elliptical, or may have any other shape, when viewed as in FIG. 1. Further, in some embodiments, nMOS and pMOS channel layer elements 108, 110 may comprise an upper surface that may be, for instance, rectangular, rectangular with rounded corners, elliptical, or any other shape. Still further, nMOS and pMOS channel layer elements 108, 110 may comprise a similarly shaped lower surface. In some embodiments, the upper and lower surfaces of the nMOS and pMOS channel layer elements 108, 110 may be substantially the same, while in other embodiments the upper and lower surfaces may differ from one another. In some embodiments, the nMOS and pMOS channel layer elements 108, 110 may have a fin structure or three-dimensional gate structure usable in fin field-effect transistor (FinFET) structures. The nMOS and pMOS channel layer elements 108, 110 may extend from an essentially planar surface defined by the upper surface of the buffer layer 106, and may comprise side surfaces that connect their respective upper surfaces with their respective lower surfaces. The side surfaces may, for example, be substantially perpendicular to a front surface of the substrate 102. The nMOS and pMOS channel layer elements 108, 110 may take other forms as well. Each of the nMOS and pMOS channel layer elements 108, 110 may be formed at the same time or separately.

The pMOS channel layer elements 110 may be formed of $Si_{1-y}Ge_y$, where y is larger than x (the Ge content of the buffer layer 106), such that the pMOS channel layer elements 108 are compressive-strained in a direction parallel to a main surface of the substrate 102. For example, y may be between about 0.35 and about 0.55. The compressive strain of the pMOS channel layer elements 110 may at least partially control a mobility and/or velocity of p-type charge carriers in the pMOS channel layer elements 110. In some embodiments, the pMOS channel layer elements 110 may be short channel layer elements having a gate length below, for example, about 30 nm. Other pMOS channel layer elements 110 are possible as well.

Similarly, the nMOS channel layer elements 108 may be formed of $Si_{1-z}Ge_z$, where z is smaller than x (the Ge content of the buffer layer 106), such that the nMOS channel layer elements 108 are tensile-strained in a direction parallel to a main surface of the substrate 102. For example, z may be between about 0 and about 0.15. In some embodiments, z may be substantially 0, such that the nMOS channel layer elements 108 are formed of substantially Si. Other values of z are possible as well. The tensile strain of the nMOS channel layer elements 108 may at least partially control a mobility and/or velocity of n-type charge carriers in the nMOS channel layer elements 108. Further, a lower Ge content in the nMOS channel layer elements 108 may facilitate the formation of more $SiO_2$, as compared to $GeO_2$, thereby easing passivation of the nMOS channel layer elements 108.

For each of the pMOS and nMOS channel layer elements 110, 108, a Ge-based oxide (e.g., $SiGeO_x$) may be formed on top of the channel layer elements during processing. Accordingly, it may be desirable to remove substantially all of such a Ge-based oxide. However, it has been shown that such removal may prove difficult with standard wet etchants, especially when the Ge concentration of the pMOS channel layer elements is substantially 0.55 (e.g., between about 0.53 and about 0.57, or between about 0.5 and about 0.6, or even between about 0.45 and about 0.65). Accordingly, for each of the pMOS and nMOS channel layer elements 110, 108, it may be desirable for the Ge concentrations to be less than about 0.55.

Moreover, when the Ge content in the pMOS and nMOS channel layer elements 110, 108 is close to 0.5, it may be difficult to maintain the strain in the pMOS and nMOS channel layer elements 110, 108 during processing, including back-end-of-line processing. It will be appreciated that pMOS and nMOS channel layer elements 110, 108 having a Ge concentration below 0.55 can withstand high temperature processing (e.g., processing at temperatures above 550° C.).

In embodiments where the CMOS device 100 includes both nMOS channel layer elements 108 and pMOS channel layer elements 110, the nMOS channel layer elements 108 and pMOS channel layer elements 110 may be electrically isolated from one another by means of one or more shallow trench isolations (STIs) 112, as shown.

As shown, the CMOS device 100 further includes a replacement gate (RPG) 114 formed on the pMOS channel layer elements 110. The RPG 114 may be formed of a dielectric layer (not shown), a selectively-removable gate layer 116, and spacers 118, as shown. The dielectric layer may, for instance, be formed of a thin epitaxial Si layer or interfacial oxide (e.g., a Si-based or Ge-based oxide), including rare earth and transition metal elements. The spacers 118 may, for example, be formed of $SiO_2$, Si nitride ($Si_3N_4$) films, or any kind of material used in the dielectric layer. The selectively-removable gate layer may, for example, be formed of polysilicon (polycrystalline silicon), $SiO_2$, or a stack of $Si_3N_4$ and $SiO_2$. Other dielectric layers, spacers, and selectively-removable gate layers are possible as well.

Figure 2:
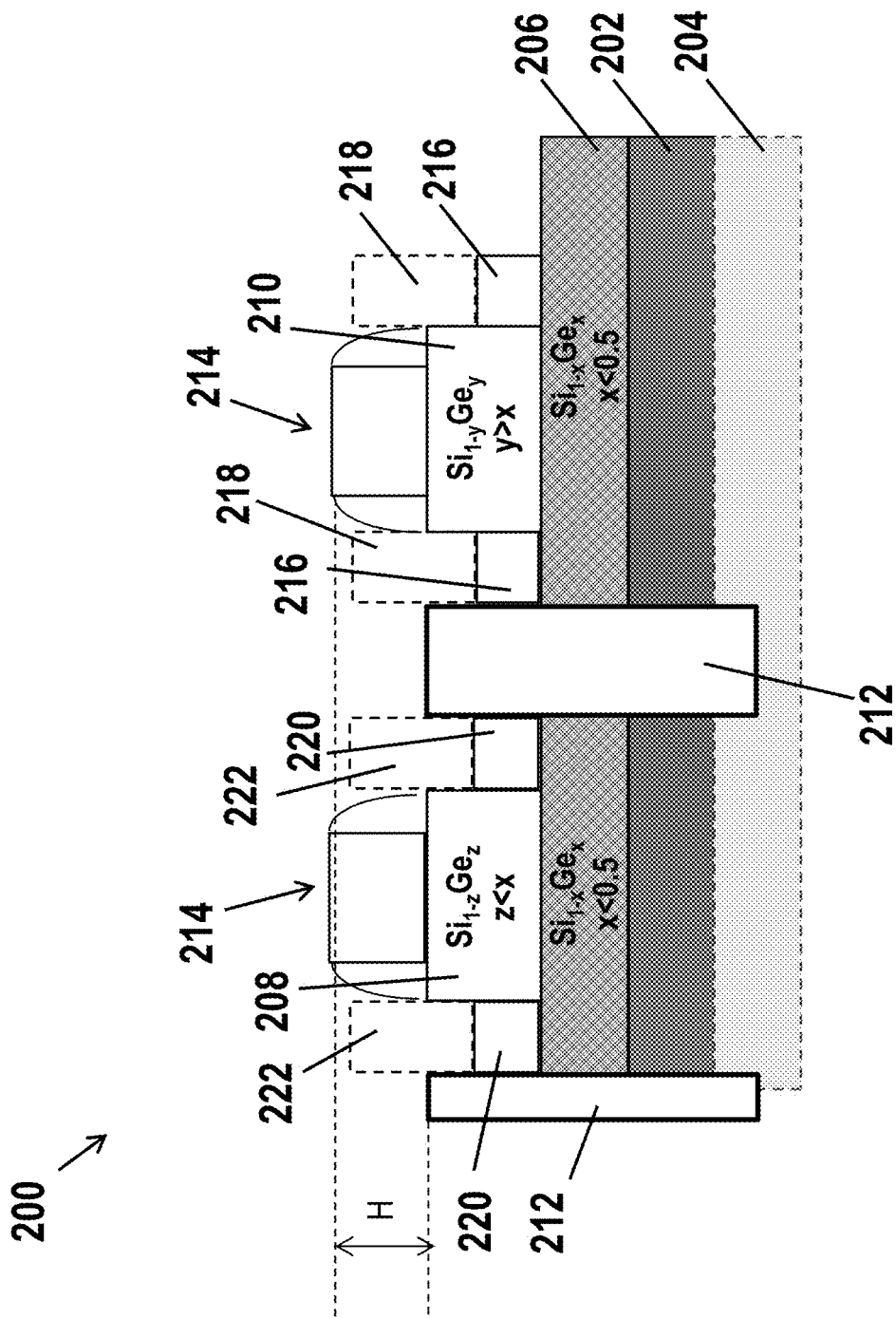
FIG. 2 illustrates another example CMOS device having elevated source-drain (E S/D) electrodes grown from a buffer layer of the example CMOS device, in accordance with some embodiments.

FIG. 2 illustrates another example CMOS device 200 having elevated source-drain (E S/D) electrodes 216, 218, 220, and 222 grown from a buffer layer 206 of the example CMOS device 200, in accordance with some embodiments. As shown, the CMOS device 200 includes a substrate 202, a buffer layer 206, nMOS channel layer elements 208, pMOS channel layer elements 210, and RPGs 214. The substrate 202, the buffer layer 206, the nMOS channel layer elements 208, the pMOS channel layer elements 210, and the RPGs 214 may take any of the forms described above for the substrate 102, the buffer layer 106, the nMOS channel layer elements 108, the pMOS channel layer elements 110, and the RPG 114, respectively, in connection with FIG. 1.

In embodiments where the substrate 202 takes the form of a SOI or sSOI substrate, the substrate 202 may be formed on an oxide layer 204, as shown. In other embodiments, no oxide layer 204 may be present.

Further, in embodiments where the CMOS device 200 includes both nMOS channel layer elements 208 and pMOS channel layer elements 210, the nMOS channel layer elements 208 and pMOS channel layer elements 210 may be electrically isolated from one another by means of one or more STIs 212, as shown.

In order to stress the pMOS and nMOS channel layer elements 208, 210 and to obtain desirable short-channel effects control and low-access resistance, the CMOS device 200 may further include E S/D electrodes 216, 218, 220, and 222. The E S/D electrodes 216, 218, 220, and 222 may be grown from the buffer layer 206. In this manner, the Ge content of the E S/D electrodes 216, 218, 220, and 222 may be properly obtained.

In particular, the E S/D electrode 216 adjacent to the pMOS channel layer elements 210 may comprise $Si_{1-p}Ge_p$, where p is greater than x (the Ge content of the buffer layer 206), and the E S/D electrode 218 adjacent to the pMOS channel layer elements 210 may comprise $Si_{1-k}Ge_k$, where k is greater than p. In this manner, the E S/D electrodes 216 and 218 may have a Ge content greater than the buffer layer 206, which may compressively strain the buffer layer 206 and, in turn, the pMOS channel layer elements 210, as the pMOS channel layer elements 210 may be thin enough to be lattice-matched with the buffer layer 206.

Similarly, the E S/D electrode 220 adjacent to the nMOS channel layer elements 210 may comprise $Si_{1-pp}Ge_{pp}$, where pp is less than x (the Ge content of the buffer layer 206), and the E S/D electrode 220 adjacent to the nMOS channel layer elements 210 may comprise $Si_{1-kk}Ge_{kk}$, where kk is less than pp. In this manner, the E S/D electrodes 220 and 222 may have a Ge content less than the buffer layer 206, which may tensilely strain the buffer layer 206 and, in turn, the nMOS channel layer elements 208, as the nMOS channel layer elements 208 may be thin enough to be lattice-matched with the buffer layer 206.

In some embodiments, one or more of the E S/D electrodes 216, 218, 220, and/or 222 may comprise other materials. For example, E S/D electrodes 216 and 218 adjacent to the pMOS channel layer elements 210 may be formed of germanium-tin (GeSn). As another example, E S/D electrodes 220 and 222 adjacent to the nMOS channel layer elements 208 may be formed of silicon carbide (Si:C). Other materials are possible as well.

As shown, the E S/D electrodes 216, 218 may be formed at a first and second end, respectively, of the pMOS channel layer elements 210. Similarly, the E S/D electrodes 220, 222 may be formed at a first and second end, respectively, of the nMOS channel layer elements 208. Further, the E S/D electrodes 216, 218 and 220, 222 may extend outwardly and above a upper surface of the pMOS and nMOS channel layer elements 210, 208, respectively, as shown. In some embodiments, the E S/D electrodes 216, 218 and 220, 222 may also extend over sidewalls of the pMOS and nMOS channel layer elements 210, 208, respectively.

In some embodiments, the E S/D electrodes 216, 218, 220, and 222 may be intrinsically (in-situ) doped. Although this may indirectly introduce dopants into the pMOS and/or nMOS channel layer elements 210, 208 or the substrate 202, it will be appreciated that the pMOS and/or nMOS channel layer elements 210, 208 or the substrate 202 does not have to be doped independently by implantation techniques. This may reduce the impact of the doping process on the intrinsic performance of small transistors. For example, the pMOS and/or nMOS channel layer elements 210, 208 may exhibit (1) improved short channel effects control (e.g., a strong reduction of the punch-through phenomenon by the use of elevated junctions), (2) improved carrier velocity, which controls the drive current $I_{ON}$ (e.g., reduced Coulomb scattering between carriers and dopants), and (3) improved variability parameter (e.g., dopant-induced effect).

In some embodiments, such as that shown, the E S/D electrodes 216, 218, 220, and 222 may not extend above the RPG 214. As a result, the RPG 214 may be more easily formed, insofar as the cavity that exists after replacement of the gate may be more easily and uniformly filled. In other embodiments, the E S/D electrodes 216, 218, 220, and 222 may extend above the RPG 214.

In some embodiments, the E S/D electrodes 216, 218, 220, and 222 may have a sufficient thickness (e.g., between about 20 nm and about 60 nm) to allow a maximum stress transfer into the pMOS and/or nMOS channel layer elements 210, 208 and to provide a low access resistance to the pMOS and/or nMOS channel layer elements 210, 208 (e.g., below about 400 Ω·μm).

In some embodiments, the RPGs 214 may be positioned between source and drain regions of the nMOS or pMOS channel layer elements 108, 110, respectively. In particular, each of the RPGs 214 and the E S/D electrodes 216, 218 or 220, 222 may cover substantially all of the upper surface of the pMOS or nMOS channel layer elements 210, 208, respectively. Further, sidewalls of the pMOS and nMOS channel layer elements 210, 208 may be substantially completely covered by the RPGS 214 and the E S/D electrodes 216, 218 and 220, 222, respectively.

Figure 3:
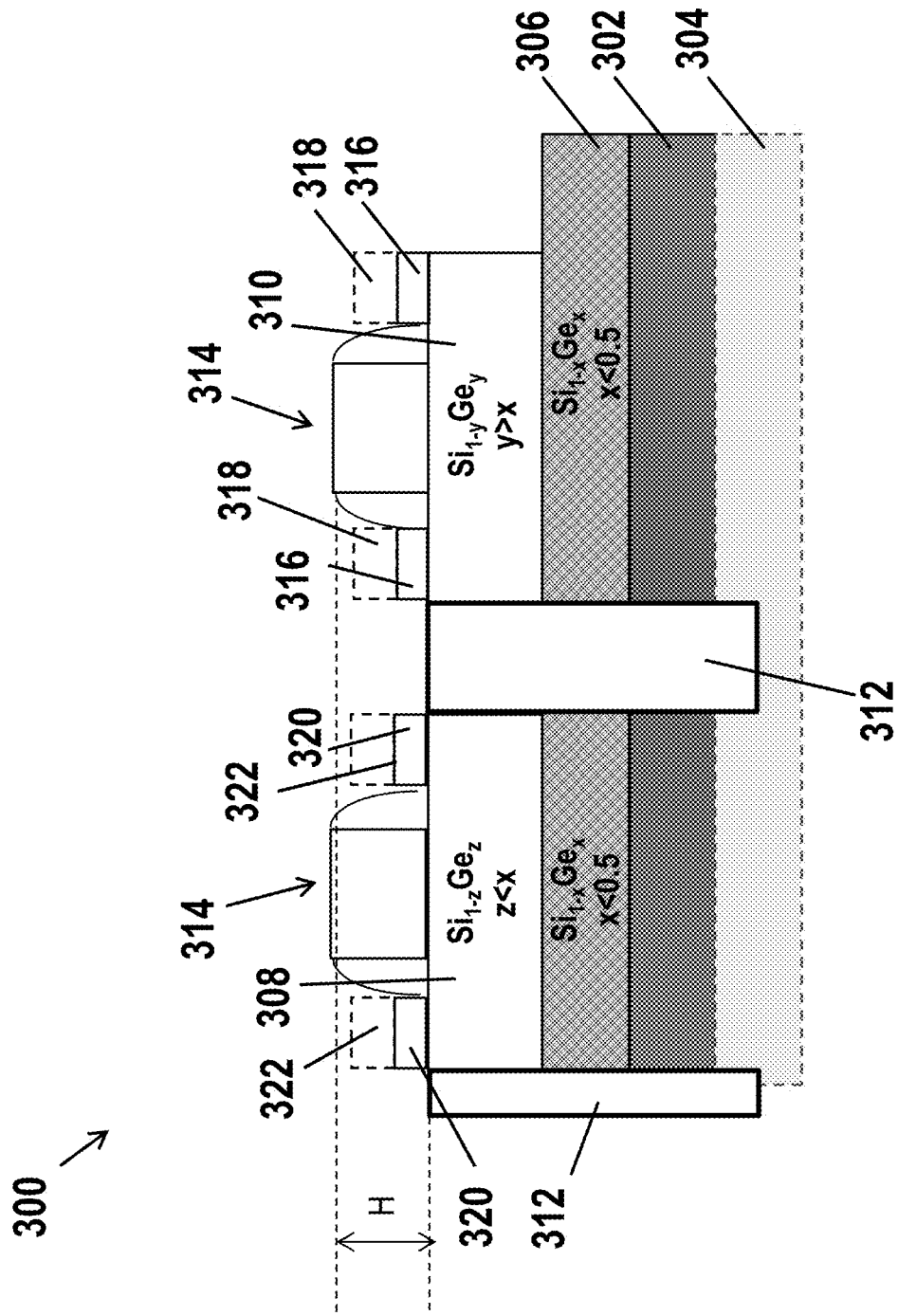
FIG. 3 illustrates an example CMOS device having E S/D electrodes grown from pMOS and nMOS channel layer elements of the example CMOS device, in accordance with some embodiments.

FIG. 3 illustrates an example CMOS device 300 having E S/D electrodes 316, 318, 320, and 322 grown from pMOS and nMOS channel layer elements 308, 310 of the example CMOS device 300, in accordance with some embodiments. As shown, the CMOS device 300 includes a substrate 302, a buffer layer 306, nMOS channel layer elements 308, pMOS channel layer elements 310, and RPGs 314. The substrate 302, the buffer layer 306, the nMOS channel layer elements 308, the pMOS channel layer elements 310, and the RPGs 314 may take any of the forms described above for the substrate 102, the buffer layer 106, the nMOS channel layer elements 108, the pMOS channel layer elements 110, and the RPG 114, respectively, in connection with FIG. 1.

In embodiments where the substrate 302 takes the form of a SOI or sSOI substrate, the substrate 302 may be formed on an oxide layer 304, as shown. In other embodiments, no oxide layer 304 may be present.

Further, in embodiments where the CMOS device 300 includes both nMOS channel layer elements 308 and pMOS channel layer elements 310, the nMOS channel layer elements 308 and pMOS channel layer elements 310 may be electrically isolated from one another by means of one or more STIs 312, as shown.

In order to stress the pMOS and nMOS channel layer elements and to obtain desirable short-channel effects control and low-access resistance, the CMOS device 300 may further include E S/D electrodes 316, 318, 320, and 322. While in FIG. 2 the E S/D electrodes 216 and 218, 220, and 222 were grown from the buffer layer 206, for the embodiments depicted in FIG. 3 the E S/D electrodes 316 and 318 may be grown from the pMOS channel layer elements 310, while the E S/D electrodes 320 and 322 may be grown from the nMOS channel layer elements 308. In this manner, the Ge content of the E S/D electrodes 316, 318, 320, and 322 may be properly obtained. One advantage of growing the E S/D electrodes 316, 318 and 320, 322 from the pMOs and nMOS channel layer elements 310, 308, respectively is that the pMOS and nMOS channel layer elements 310, 308 may exhibit enhanced stress by limiting strain relaxation that occurs during formation (e.g., etching) of the pMOS and nMOS channel layer elements 310, 308.

Figure 4:
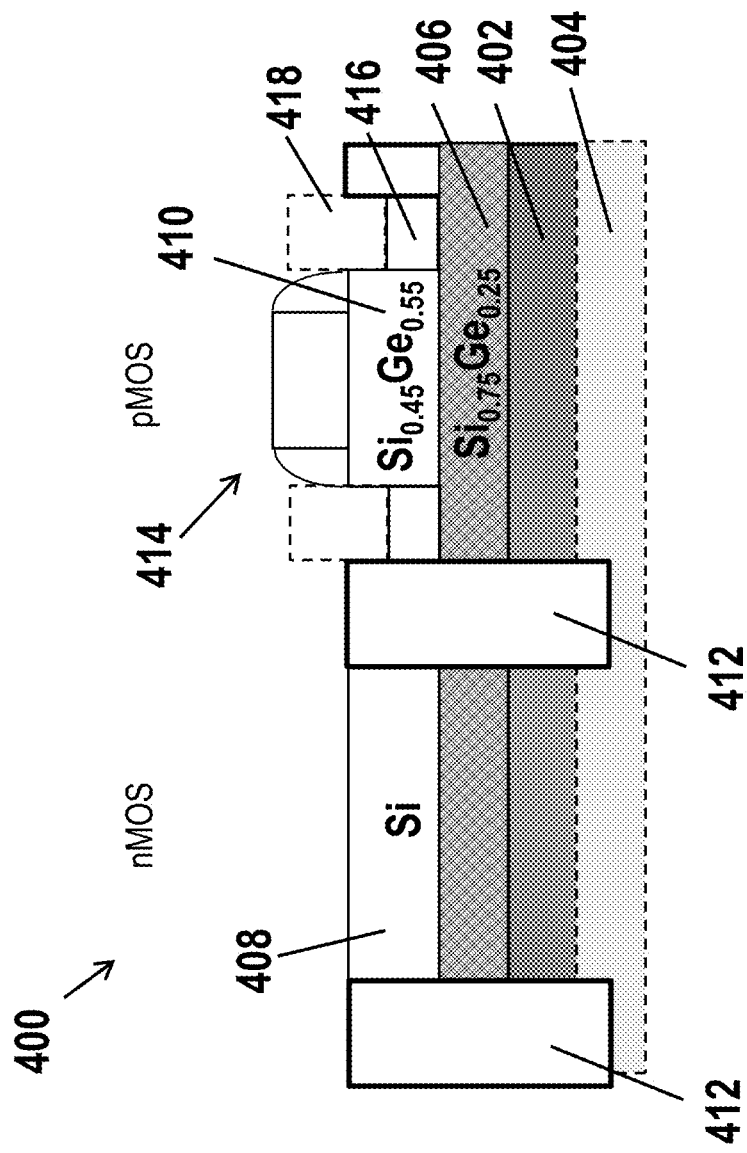
FIG. 4 illustrates still an example CMOS device in which nMOS channel layer elements are formed of silicon, in accordance with some embodiments.

FIG. 4 illustrates still an example CMOS device 400 in which nMOS channel layer elements 408 are formed of silicon, in accordance with some embodiments. As shown, the CMOS device 400 includes a substrate 402, a buffer layer 406, and a RPG 414. The substrate 402, the buffer layer 406, and the RPGs 414 may take any of the forms described above for the substrate 102, the buffer layer 106, and the RPG 114, respectively, in connection with FIG. 1.

In embodiments where the substrate 402 takes the form of a SOI or sSOI substrate, the substrate 402 may be formed on an oxide layer 404, as shown. In other embodiments, no oxide layer 404 may be present.

As shown, the CMOS device 400 further includes nMOS channel layer elements 408 and pMOS channel layer elements 412. In some embodiments, the CMOS device 400 may include only one or the other of the nMOS and pMOS channel layer elements 408, 410. Alternatively, in embodiments where the CMOS device 400 includes both nMOS channel layer elements 408 and pMOS channel layer elements 410, the nMOS channel layer elements 408 and pMOS channel layer elements 410 may be electrically isolated from one another by means of one or more STIs 412, as shown.

The buffer layer 406 may be formed of $Si_{0.75}Ge_{0.25}$. The nMOS channel layer 408 may be formed of silicon. Further, the pMOS channel layer 410 comprises $Si_{0.55}Ge_{0.45}$. Such a Ge concentration in the pMOS channel layer 410 may be compatible with typical cleaning procedures, such that the pMOS channel layer 410 need not be cleaned using any exotic surface passivation (e.g., a Si-free passivation cap enabler).

As shown, the CMOS device 400 further includes E S/D electrodes 416, 418, which may take any of the forms described above for the E S/D electrodes 216, 218 in connection with FIG. 2. In some embodiments, the E S/D electrodes 416, 418 may be graded layers in which the Ge concentration increases in an upwards direction, away from the buffer layer. For example, the E S/D electrode 416 may comprise $Si_{0.75}Ge_{0.25}$, while the E S/D electrode 418 and $Si_{0.55}Ge_{0.45}$ respectively. More generally, the E S/D electrode 416 may have a Ge concentration ranging from greater than the Ge concentration of the buffer layer 406 up to about 25%, and the E S/D electrode 418 may have a Ge concentration ranging from greater than the Ge concentration of the E S/D electrode 416 to about 55%. The Ge concentration may thus increase in an upwards direction from the buffer layer 406, upwards through the E S/D electrode 416 and upwards through the E S/D electrode 418. Such a Ge concentration may serve to maximize stress transfer into the nMOS and pMOS channel layer elements 408, 410 via the buffer layer 406 and minimize access resistance. Further, in embodiments where the E S/D electrodes 416, 418 are graded layers, the E S/D electrode 416 may exhibit both a desirable thickness and a desirable strain.

Figure 5:
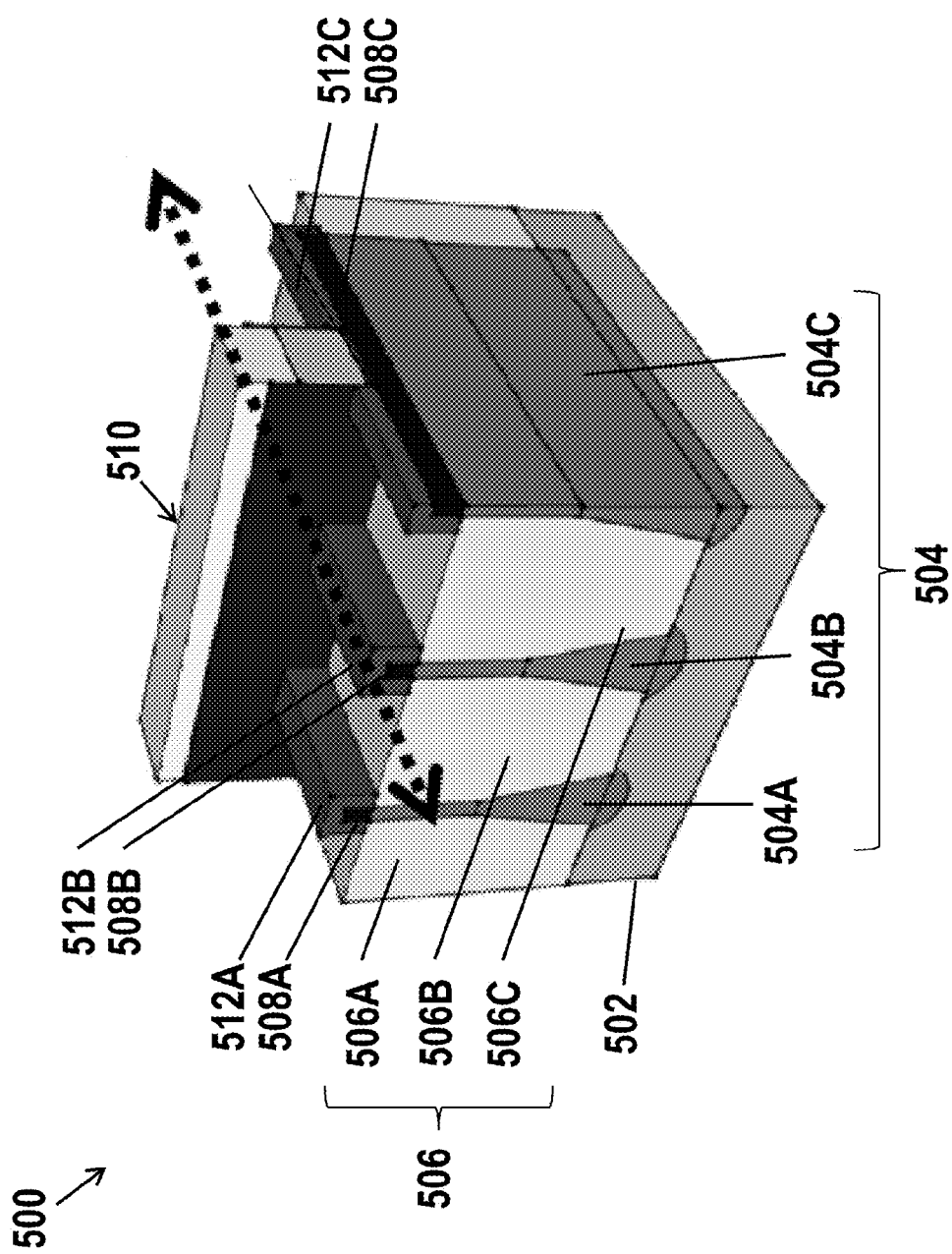
FIG. 5 depicts a perspective view of an example Fin Field-Effect Transistor (FinFET) CMOS device, in accordance with some embodiments.

The above-described CMOS device 400 may be desirable for at least the reason that the CMOS device 400 may allow for the use of a silicon channel to form nFETs, which is standard in industry. Further, the lattice match between the nMOS and pMOS channel layer elements 408, 410 may be voluntarily limited so as to maintain an appropriate strain in the nMOS and pMOS channel layer elements 408, 410, even after full processing of the CMOS device 400. Still further, In some embodiments, the disclosed CMOS devices may take the form of Fin Field-Effect Transistor (FinFET) CMOS devices. FIG. 5 depicts a perspective view of an example FinFET CMOS device 500, in accordance with some embodiments. In particular, the dotted line shown in FIG. 5 illustrates a direction perpendicular to the views of the CMOS devices 100, 200, 300, and 400 shown in FIGS. 1-4, respectively.

As shown, the FinFET CMOS device 500 includes a substrate 502. The substrate 502 may take any of the forms described above for the substrate 102 in connection with FIG. 1. While not shown, in some embodiments the substrate 502 may take the form of a SOI or sSOI substrate, in which cases the substrate 502 may be formed on an oxide layer (not shown). In other embodiments, such as that shown, no oxide layer may be present.

The FinFET CMOS device 500 further includes a buffer layer 504 formed of three buffer elements 504A, 504B, 504C. As shown, the buffer elements 504A, 504B, 504C are formed in a longitudinal direction and are substantially parallel to one another. Further, as shown, the buffer elements 504A, 504B, 504C are separated from one another by oxide elements 506A, 506B, 506C. In some embodiments, the oxide elements 506A, 506B, 506C may be formed of a material other than an oxide.

Each of the buffer elements 504A, 504B, 504C may abut a respective channel layer element 508A, 508B, or 508C, as shown. In particular, as shown, a channel layer element 508A may abut buffer element 504A, a channel layer element 508B may abut buffer element 504B, and a channel layer element 508C may abut buffer element 504C. Each of the channel layer elements 508A, 508B, 508C may be of the same type (e.g., all p-type or all n-type), or may be different types (e.g., some p-type and another n-type or some n-type and another p-type).

In the FinFET CMOS device 500, the channel layer elements 508A, 508B, 508C may form a single FIN structure or a multiple FINs structure (e.g., a three-dimensional gate structure). For example, as shown, a RPG 510 may be provided over portions of the channel layer elements 508A, 508B, 508C. The RPG 510 may take any of the forms described above for the RPG 114 described above in connection with FIG. 1. The RPG 510 may be formed with a longitudinal direction substantially perpendicular to a longitudinal direction of the channel layer elements 508A, 508B, 508C, as shown.

Further, as shown, E S/D electrodes 512A, 512B, 512C may be formed over the portions of the channel layer elements 508A, 508B, 508C not covered by the RPG 510. The E S/D electrodes 512A, 512B, 512C may take any of the forms described above for the E S/D electrodes 216, 218, 220, 222 described above in connection with FIG. 2.

Figure 6B:
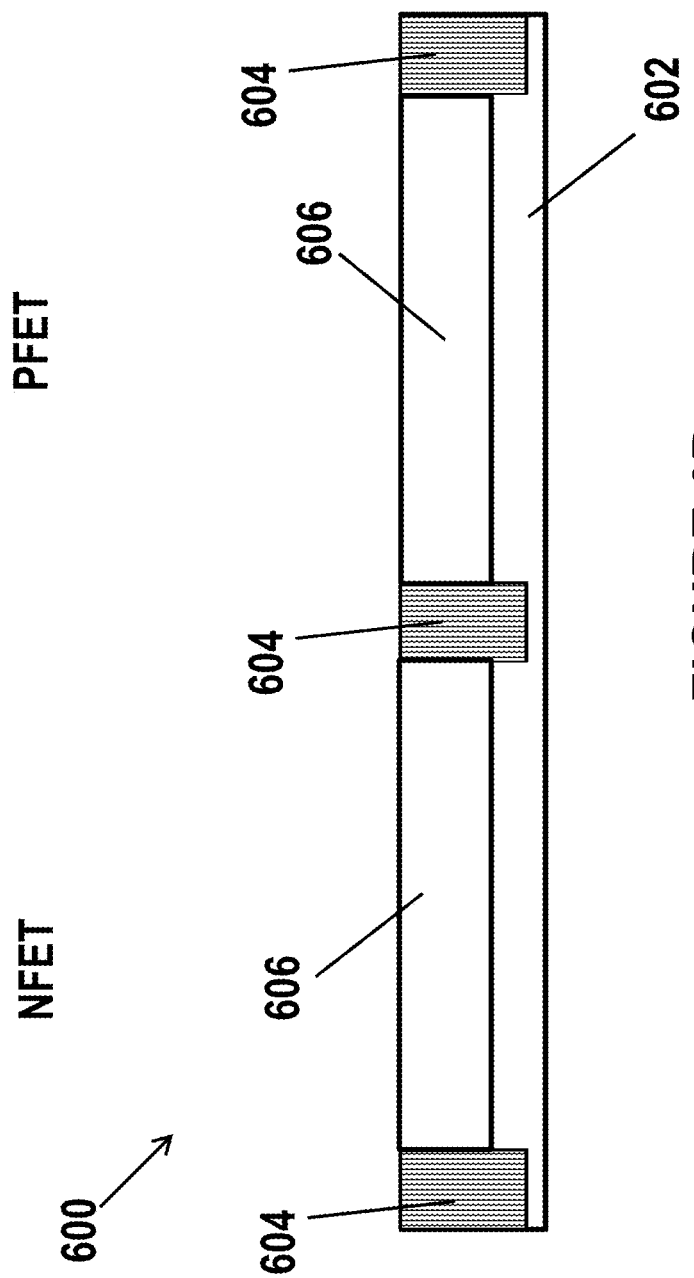
FIGS. 6A-N illustrate an example method of manufacturing CMOS devices, in accordance with some embodiments.
Figure 6E:
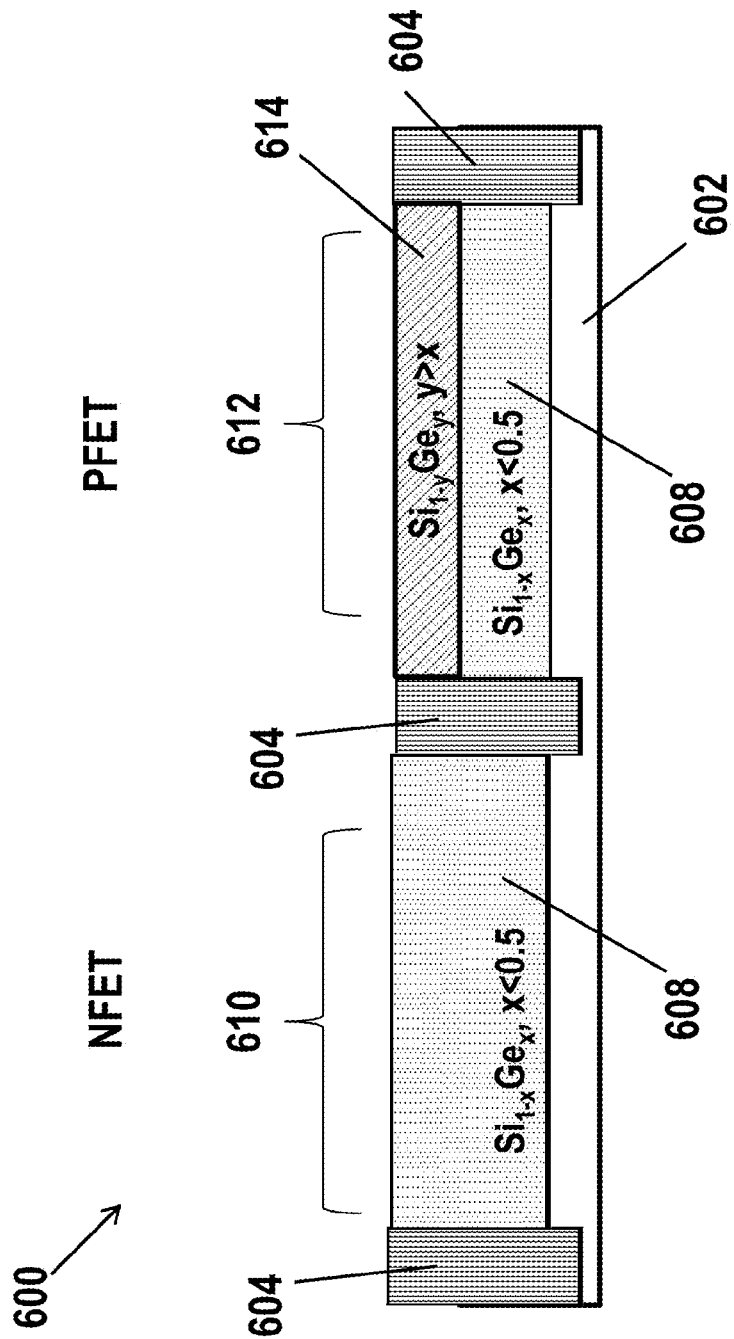
Figure 6F:
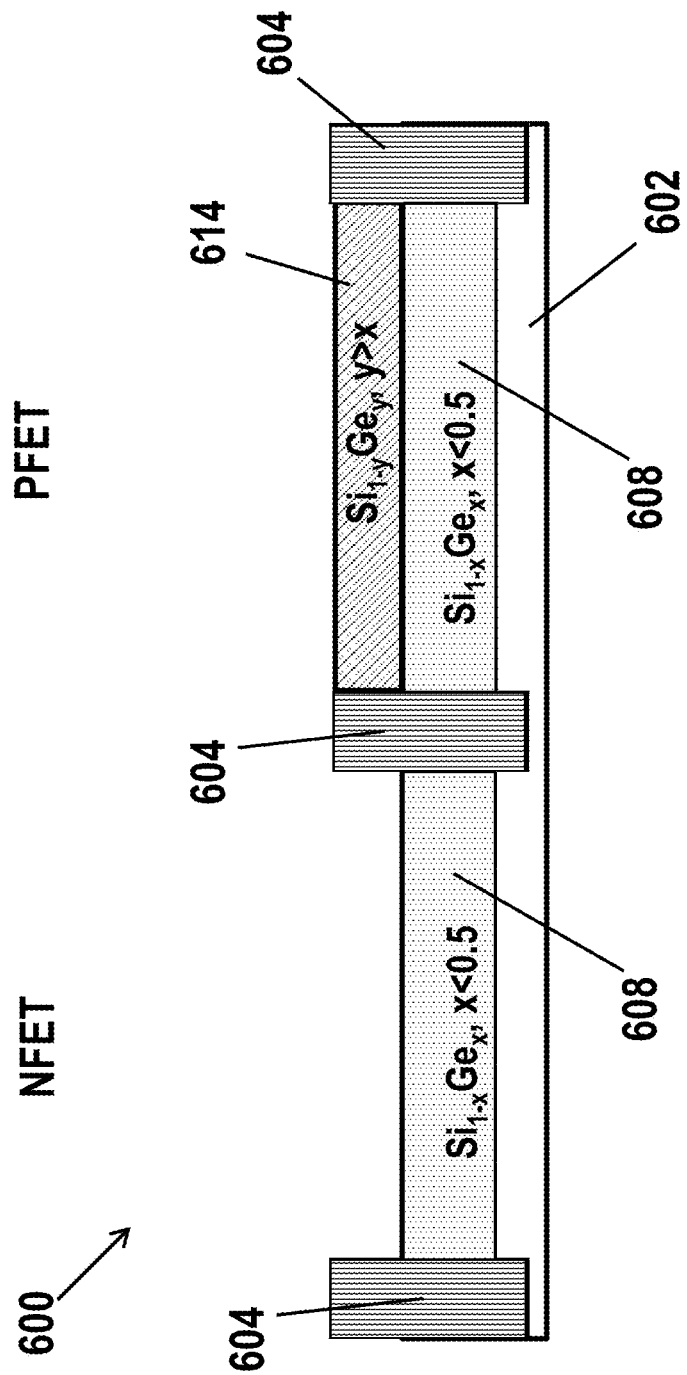
Figure 6G:
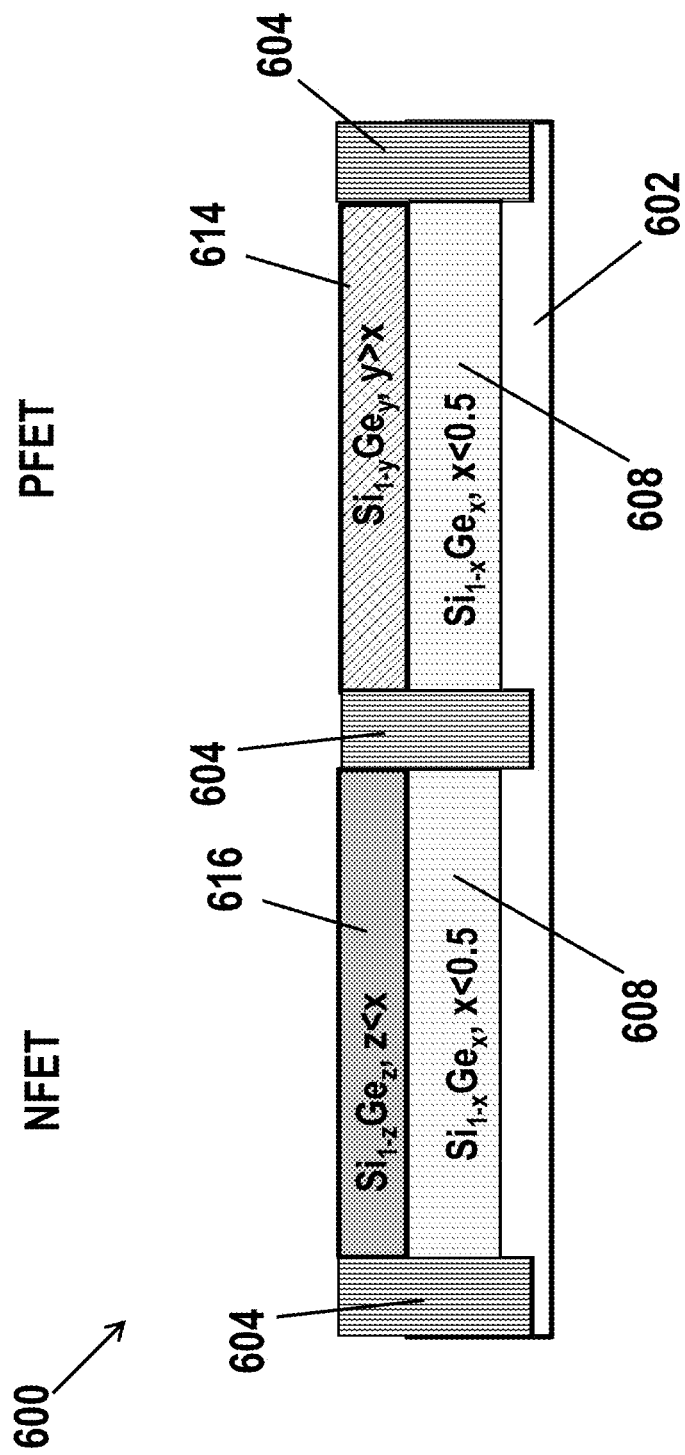
Figure 6H:
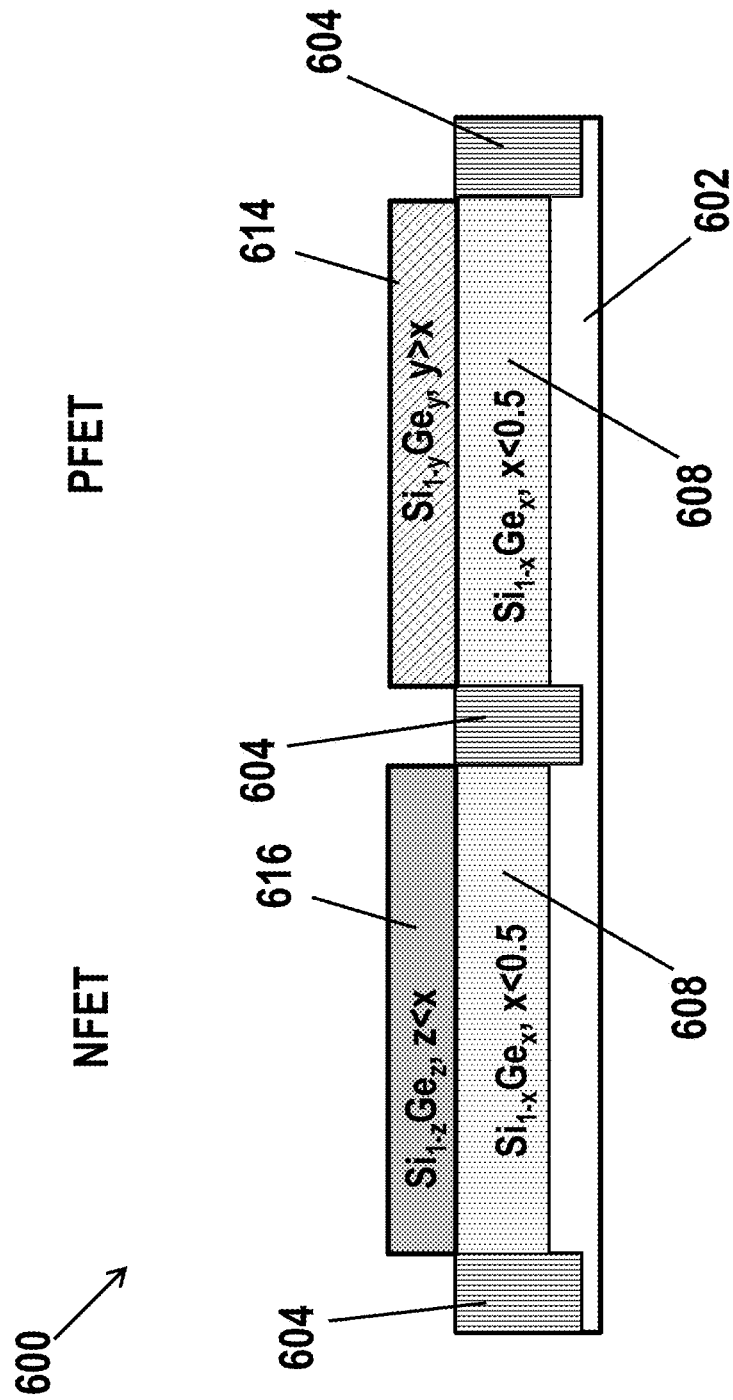
Figure 6I:
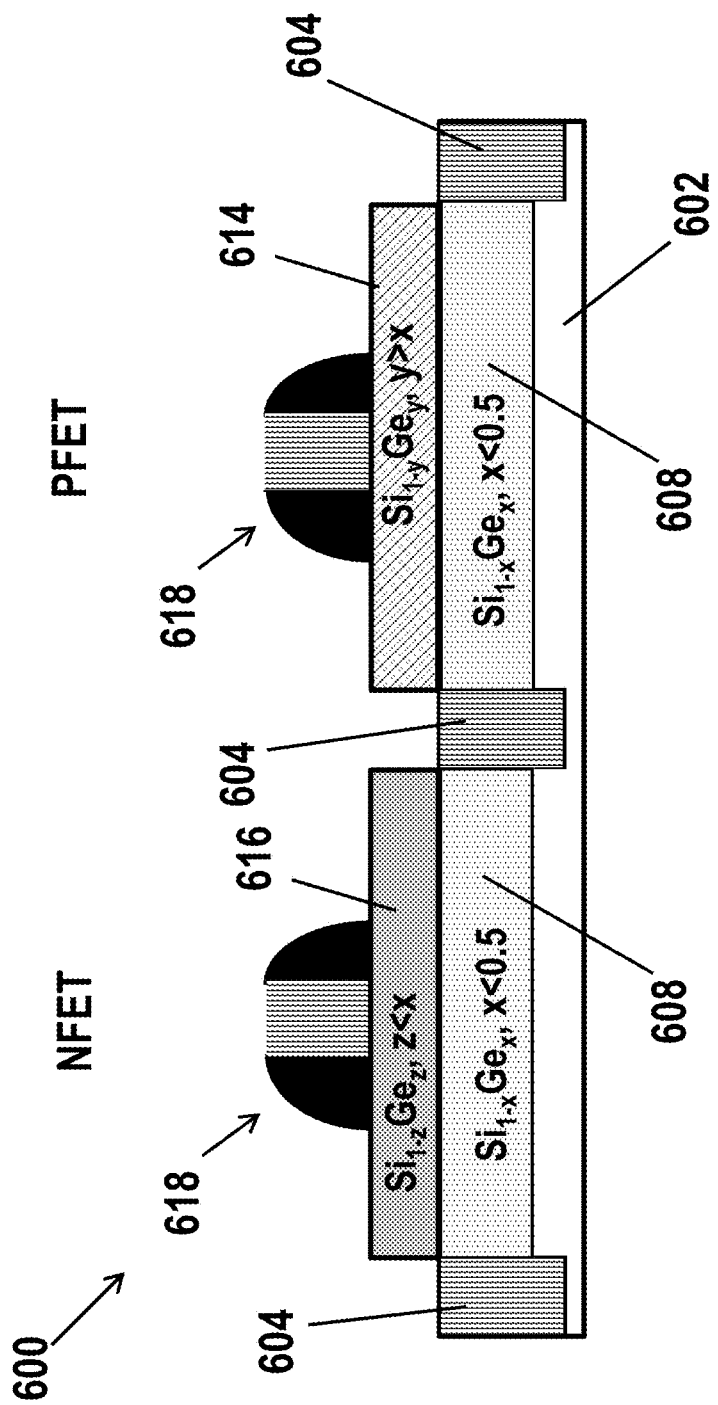
Figure 6J:
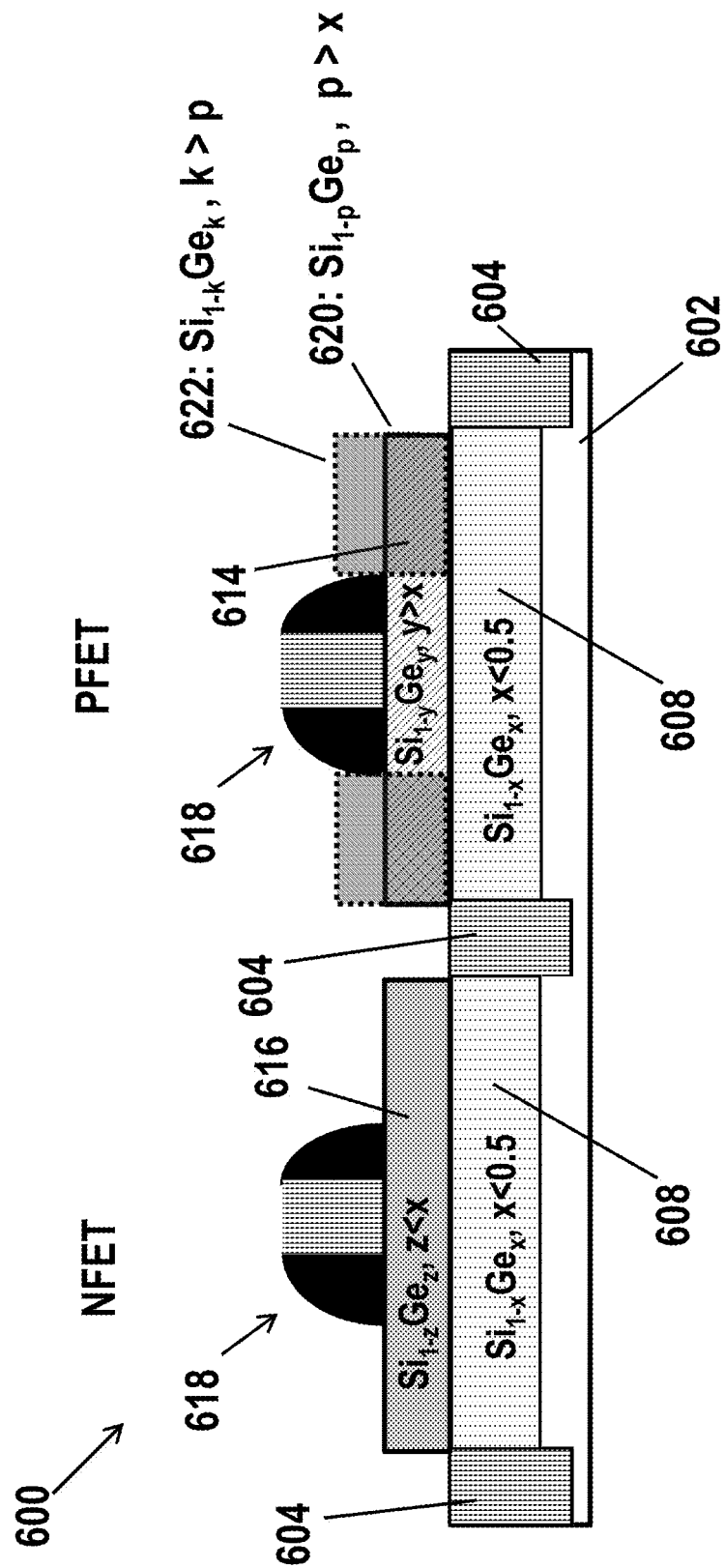
Figure 6K:
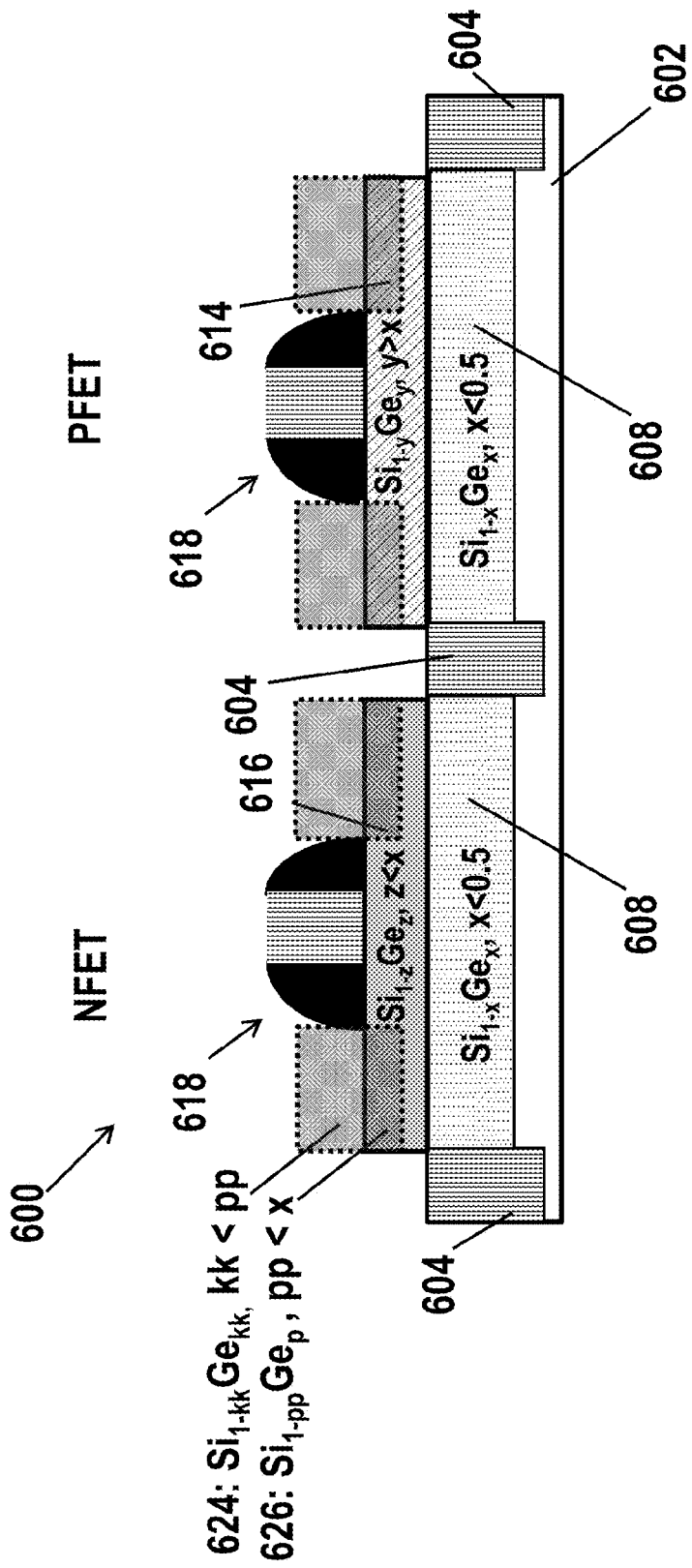
Figure 6L:
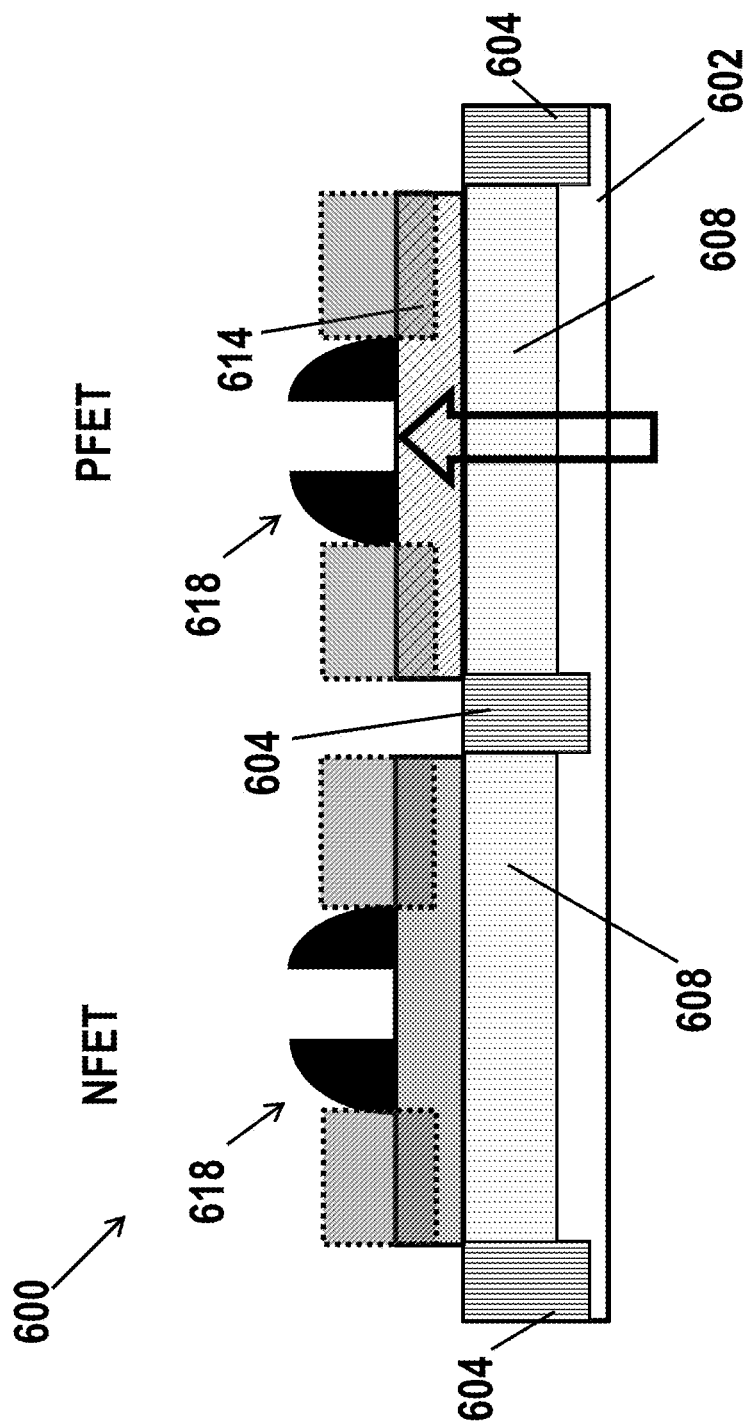
Figure 6M:
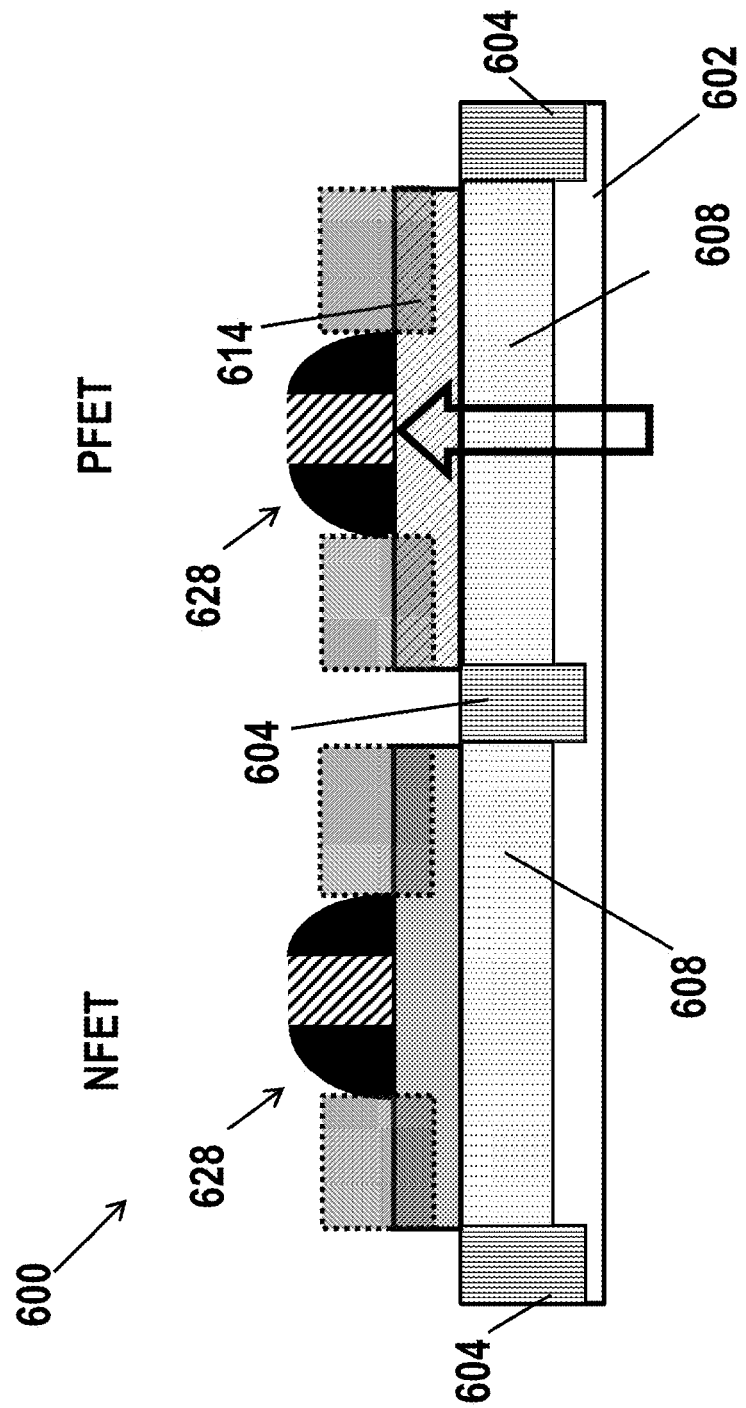
Figure 6N:
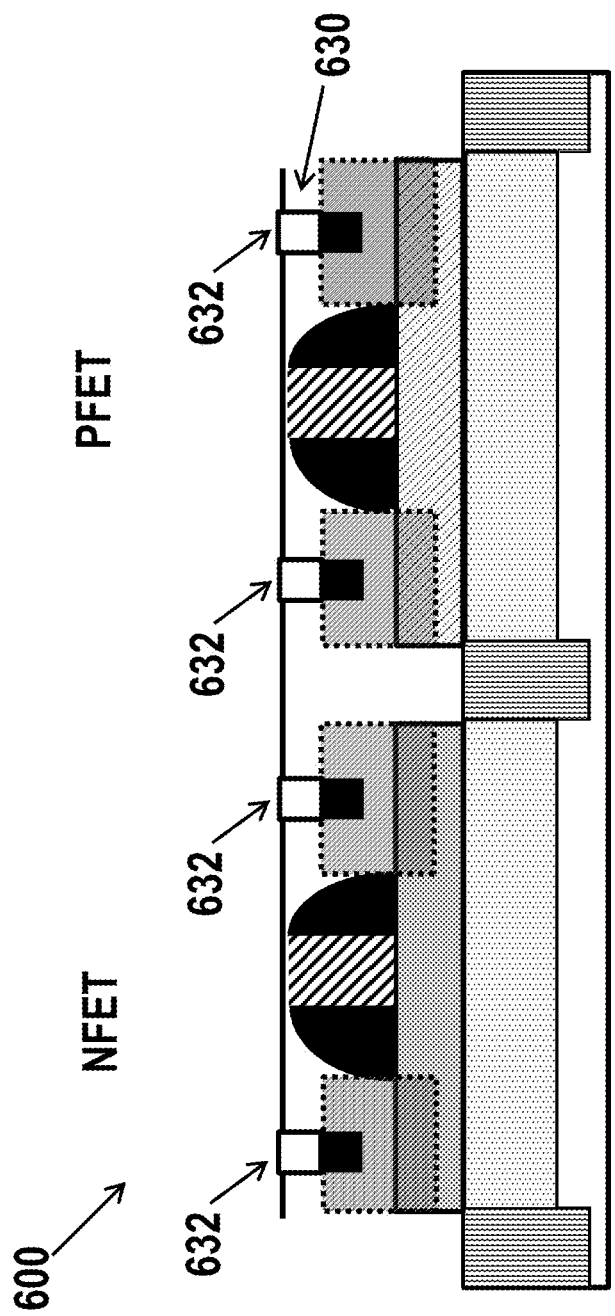

FIGS. 6A-N illustrate an example method of manufacturing CMOS devices, in accordance with some embodiments. In particular, FIGS. 6A-N illustrate an example method of manufacturing a FinFET CMOS device 600.

As shown in FIG. 6A, a substrate 602 may be provided. The substrate 602 may take any of the forms described above for the substrate 102 in connection with FIG. 1. For example, the substrate 602 may be a Si in shallow-trench isolation (Si-in-STI) substrate, a SiGe bulk substrate, a SOI substrate, or a sSOI substrate. Other substrates are possible as well.

In embodiments where the substrate 602 is a Si-in-STI substrate, an isolation material used for the trenches (e.g., $SiO_2$) may be provided in multiple steps. For example, a Si wafer with shallow trenches may be provided, a high thermal oxide may be grown on the Si wafer, and a low thermal plasma oxide 604 may be deposited on the high thermal oxide, thereby filling the trenches. Finally a chemical mechanical polish (CMP) may be carried out to fully planarize the Si wafer. The substrate 602 may be provided in other manners as well.

As shown in FIG. 6B, recesses 606 may then be formed between the oxide 604 deposited in the trenches, thereby enabling the epitaxial grown of a SiGe buffer layer 608, as shown in FIG. 6C. Thereafter, the buffer layer 608 may undergo a CMP, such that a substantially flat buffer layer 608 is formed, as shown in FIG. 6D.

A pFET channel layer 614 may be formed on the buffer layer 608, as shown in FIG. 6E. To this end, an nFET region 610 of the buffer layer 608 may be masked (e.g., by an oxide), a pFET region 612 of the buffer layer 608 may be recessed, and a pFET channel layer 614 having a higher Ge concentration than the buffer layer 608 may be epitaxially grown, as shown.

Similarly, an nFET channel layer element 616 may be formed on the buffer layer 608. To this end, the pFET channel layer 614 may be masked (e.g., by an oxide), the nFET region 610 of the buffer layer 608 may be recessed, as shown in FIG. 6F. Further, as shown in FIG. 6G, an nFET channel layer 616 having a lower Ge concentration than the buffer layer 608 may be epitaxially grown, as shown. In some embodiments, the nFET channel layer 616 may have a Ge concentration of substantially zero, such that the nFET channel layer 616 is substantially a Si layer.

FIGS. 6H-I illustrates the forming of a fin for the FinFET CMOS device 600. As shown in FIG. 6H, in order to form the fin, the oxide 604 may be recessed. Further, as shown in FIG. 6I, gate stack 618 and spacer regions may be formed on each of the pFET channel layer 614 and the nFET channel layer 616.

FIG. 6J illustrates the forming of the pFET component. In particular, as shown, E S/D electrodes 620, 622 may be grown from the pFET channel layer 614 (or directly from the buffer layer 606, as described above) in a manner similar to that used to form the pFET channel layer 614. Similarly, as shown in FIG. 6K, E S/D electrodes 624, 626 may be grown from the nFET channel layer 616 (or directly from the buffer layer 606, as described above) in a manner similar to that used to form the nFET channel layer 616. The E S/D electrodes 620, 622, 624, 626 may take any of the forms described above for the E S/D electrodes 216, 218, 220, 222 described above in connection with FIG. 2. In some embodiments, an upper surface of the pFET and/or nFET channel layers 614, 616 and/or the buffer layer 608 may be cleaned before the E S/D electrodes 620, 622, 624, and/or 626 are formed.

In some embodiments, the pFET and nFET channel layers 614, 616 may be partially or fully etched away in an area covered by the E S/Ds 620, 622, 624, 626 so as to improve strain and reduce access resistance, as described above.

In embodiments where the gate stack 618 includes a selectively-removable gate layer, the selectively-removable gate layer may be replaced with a RPG 628, as shown in FIGS. 6L-M. In particular, as shown in FIG. 6L, the selectively-removable gate layer may be removed. In some embodiments, when the selectively-removable gate layer is removed, an upper surface of the pFET and/or nFET channel layers 614, 616 may be cleaned before providing a gate dielectric and metal, as described below.

Further, as shown in FIG. 6M, a gate dielectric and a metal (having a work function selected for a desired application of the FinFET CMOS device 600, e.g., ultra-low standby power, low power, high performance, etc.) may be deposited in place of the selectively-removable gate layer, thereby forming the RPG 628.

Typical back-end-of-line operations may be performed, as shown in FIG. 6N, such as forming a dielectric layer 630 and contacts 632 to the E E/D electrodes 620, 622, 624 626. Other back-end-of-line operations may be performed as well.

Figure 7:
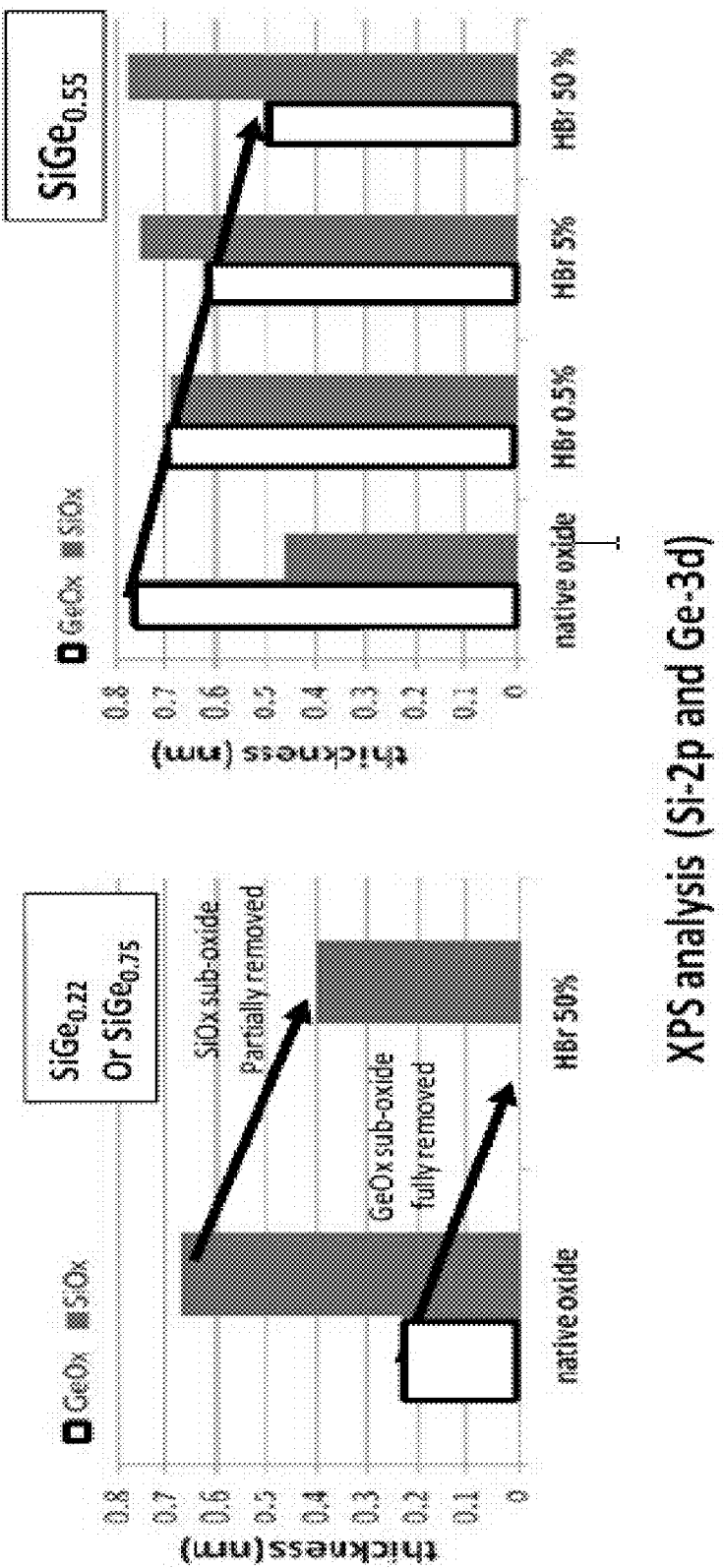
FIG. 7 illustrates experimental results obtained from example CMOS devices manufactured in accordance with some embodiments.

FIG. 7 illustrates experimental results obtained from example CMOS devices manufactured in accordance with some embodiments. The experimental results suggest that the disclosed CMOS devices may be easier to clean than typical CMOS devices.

The graph on the right-hand side of FIG. 7 shows a thickness of remaining GeOx and SiOx layers following native oxide and HBr 50% removal processes for a SiGe layer having a Ge concentration of 0.55 ($Si_{0.45}Ge_{0.55}$). By comparison, the graph on the left-hand side of FIG. 7 shows a thickness of remaining GeOx and SiOx layers following native oxide and HBr 50% removal processes, for SiGe layers having a concentration of Ge that is substantially higher ($Si_{0.22}Ge_{0.7}$) and substantially lower ($Si_{0.78}Ge_{0.22}$) than 0.55. As shown in FIG. 7, the SiGe layers having a concentration of Ge that is substantially higher ($Si_{0.22}Ge_{0.75}$) or substantially lower ($Si_{0.78}Ge_{0.22}$) than 0.55 are significantly easier to clean. For example, sub-oxide GeOx was, as shown, fully removed in this experiment by the HBr 50% removal process. The SiOx can be removed using a typical HF-based or tetramethylammonium hydroxide (TMAH) based removal process. Due to this improved facility of cleaning, it may be desirable in some embodiments to use a SiGe layer having a Ge concentration substantially higher or lower than 0.55 as the pFET (or pMOS) channel layer. SiGe layers having Ge concentrations of approximately 0.55 may result in difficulty growing the E S/D electrodes or a possibility of contaminants on the pFET (or pMOS) channel layer elements following removal of the selectively-removable gate layer that cannot be removed when depositing the RPG, as described above.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

The invention claimed is:

1. A fin field-effect transistor (FinFET) complementary metal-oxide-semiconductor (CMOS) device, comprising:
   a substrate;
   a buffer layer formed on the substrate, wherein the buffer layer comprises $Si_{1-x}Ge_x$, wherein x is greater than 0 and less than 0.5;
   one or more pMOS channel layer elements formed on the buffer layer, wherein each pMOS channel layer element comprises $Si_{1-y}Ge_y$, wherein y is greater than x;
   one or more nMOS channel layer elements formed on the buffer layer, wherein each nMOS channel layer element comprises $Si_{1-z}Ge_z$, wherein z is less than x;
   a first fin structure comprising the one or more pMOS channel layer elements;
   a second fin structure comprising the one or more nMOS channel layer elements; and
   further comprising at least one of:
   (i) a first elevated source-drain (E S/D) electrode formed adjacent to the one or more pMOS channel layer elements, wherein the first E S/D comprises $Si_{1-p}Ge_p$, and wherein p is greater than x, and a second E S/D formed adjacent to the one or more pMOS channel layer elements, wherein the second E S/D comprises $Si_{1-k}Ge_k$, and wherein k is greater than p; or
   (ii) a third elevated source-drain (E S/D) electrode formed adjacent to the one or more nMOS channel layer elements, wherein the first E S/D comprises $Si_{1-pp}Ge_{pp}$, and wherein pp is less than x, and a fourth E S/D formed adjacent to the one or more nMOS channel layer elements, wherein the second E S/D comprises $Si_{1-kk}Ge_{kk}$, and wherein kk is less than pp.

2. The FinFET CMOS device of claim 1, further comprising at least one of:
   (i) a first replacement gate formed on the one or more pMOS channel elements; or
   (ii) a second replacement gate formed on the one or more nMOS channel elements.

3. A method, comprising:
   providing a substrate;
   forming a buffer layer on the substrate, wherein the buffer layer comprises $Si_{1-x}Ge_x$, wherein x is greater than 0 and less than 0.5;
   forming one or more pMOS channel layer elements on the buffer layer, wherein each pMOS channel layer element comprises $Si_{1-y}Ge_y$, wherein y is greater than x;
   forming one or more nMOS channel layer elements on the buffer layer, wherein each nMOS channel layer element comprises $Si_{1-z}Ge_z$, wherein z is less than x; and
   forming at least one of:
   (i) a first elevated source-drain (E S/D) electrode adjacent to the one or more pMOS channel layer elements, wherein the first E S/D comprises $Si_{1-p}Ge_p$, and wherein p is greater than x, and a second E S/D adjacent to the one or more pMOS channel layer elements, wherein the second E S/D comprises $Si_{1-k}Ge_k$, and wherein k is greater than p; or
   (ii) a third elevated source-drain (E S/D) electrode adjacent to the one or more nMOS channel layer elements, wherein the first E S/D comprises $Si_{1-pp}Ge_{pp}$, and wherein pp is less than x, and a fourth E S/D adjacent to the one or more nMOS channel layer elements, wherein the second E S/D comprises $Si_{1-kk}Ge_{kk}$, and wherein kk is less than pp.

4. The method of claim 3, further comprising forming at least one of:
   (i) a first replacement gate (RPG) formed on the one or more pMOS channel layer elements; or
   (ii) a second RPG formed on the one or more nMOS channel layer elements.

5. The method of claim 3, wherein x is between about 0.15 and about 0.45.

* * * * *